US010100569B2

(12) United States Patent
Sugiura

(10) Patent No.: US 10,100,569 B2
(45) Date of Patent: Oct. 16, 2018

(54) OPERATION INPUT DETECTION DEVICE AND CONTROL DEVICE FOR VEHICULAR OPENING-CLOSING BODY

(71) Applicant: AISIN SEIKI KABUSHIKI KAISHA, Kariya-shi (JP)

(72) Inventor: Takehiko Sugiura, Kariya (JP)

(73) Assignee: AISIN SEIKI KABUSHIKI KAISHA, Kariya (JP)

( * ) Notice: Subject to any disclaimer, the term of this patent is extended or adjusted under 35 U.S.C. 154(b) by 0 days.

(21) Appl. No.: 15/341,508

(22) Filed: Nov. 2, 2016

(65) Prior Publication Data
US 2017/0130509 A1 May 11, 2017

(30) Foreign Application Priority Data

Nov. 5, 2015 (JP) ................... 2015-217617

(51) Int. Cl.
E05F 15/73 (2015.01)
B60J 5/06 (2006.01)

(52) U.S. Cl.
CPC ............. E05F 15/73 (2015.01); B60J 5/062 (2013.01); E05Y 2900/531 (2013.01); E05Y 2900/546 (2013.01)

(58) Field of Classification Search
CPC .......... E05F 15/14; E05F 15/638; G01B 7/16; E06B 9/68
USPC ............ 187/393; 318/466; 49/212, 216, 223
See application file for complete search history.

(56) References Cited

U.S. PATENT DOCUMENTS

| 6,216,393 B1* | 4/2001 | Apprich ............... E05F 15/638 49/212 |
| 2008/0100247 A1* | 5/2008 | Averitt ............... G05B 19/0428 318/466 |
| 2014/0339024 A1* | 11/2014 | Tyni ...................... B66B 5/0006 187/393 |
| 2017/0130509 A1* | 5/2017 | Sugiura .................. E05F 15/73 |

FOREIGN PATENT DOCUMENTS

| JP | 2015-21236 | 2/2015 |
| JP | 2015-21237 | 2/2015 |
| JP | 2015-21238 | 2/2015 |
| WO | WO 2012/084111 A1 | 6/2012 |

* cited by examiner

Primary Examiner — Thomas G Black
Assistant Examiner — Wae Lenny Louie
(74) Attorney, Agent, or Firm — Oblon, McClelland, Maier & Neustadt, L.L.P.

(57) ABSTRACT

An operation input detection device includes: a side-surface proximity sensor that is provided at a lower side surface portion of a vehicle; and an operation input detection portion that detects an operation input based on a sensor output of the side-surface proximity sensor, wherein the operation input detection portion determines that the operation input is performed in a case where when a change in the sensor output indicating proximity of a detection object is detected, after a first peak is detected in an acceleration of the sensor output, a second peak is detected in the same direction as that of the first peak at a first predetermined interval that is set in advance.

10 Claims, 9 Drawing Sheets

OPERATION INPUT DETECTION DEVICE AND CONTROL DEVICE FOR VEHICULAR OPENING-CLOSING BODY

CROSS REFERENCE TO RELATED APPLICATIONS

This application is based on and claims priority under 35 U.S.C. § 119 to Japanese Patent Application 2015-217617, filed on Nov. 5, 2015, the entire contents of which are incorporated herein by reference.

TECHNICAL FIELD

This disclosure relates to an operation input detection device and a control device for a vehicular opening-closing body.

BACKGROUND DISCUSSION

In the related art, there is an operation input detection device that is capable of detecting an operation input with respect to an opening-closing body such as a door in a non-contact manner based on a sensor output of a proximity sensor provided in a vehicle. For example, in a vehicle described in International Publication No. 2012/084111, a proximity sensor is provided at a lower surface portion thereof, specifically, at a lower surface end portion of a rear bumper. Then, a configuration which detects an operation input with respect to a back door provided at a rear opening of the vehicle based on a sensor output of the proximity sensor is provided.

That is, in a case of the related art, a user inserts a foot tip below the rear bumper and brings the foot tip near the lower surface end portion of the rear bumper at which the proximity sensor is provided. Therefore, it is possible to perform an operation input with respect to the back door in a non-contact manner. Furthermore, in the related art, a second proximity sensor is provided at a lower side surface portion in the vicinity of the proximity sensor, specifically, at a side surface portion of the rear bumper. Therefore, detection accuracy is improved by using a sensor output of the second proximity sensor in combination.

However, in the related art described above, when the user brings the foot tip inserted below a vehicle to be near the lower surface portion of the vehicle in which the proximity sensor is provided as described above, a weight of the user is in a state of being supported on one foot. Therefore, for example, in a case where the user has baggage in both hands, or in a case where a foothold is poor, and the like, there is a problem that it is difficult to maintain a balance. Therefore, in this regard, a room is left for improvement.

SUMMARY

Thus, a need exists for an operation input detection device and a control device for a vehicular opening-closing body which are not susceptible to the drawback mentioned above.

It is preferable that an operation input detection device according to an aspect of this disclosure includes a side-surface proximity sensor that is provided at a lower side surface portion of a vehicle; and an operation input detection portion that detects an operation input based on a sensor output of the side-surface proximity sensor. It is preferable that the operation input detection portion determines that the operation input is performed in a case where when a change in the sensor output indicating proximity of a detection object is detected, after a first peak is detected in an acceleration of the sensor output, a second peak is detected in the same direction as that of the first peak at a first predetermined interval that is set in advance.

A control device for a vehicular opening-closing body according to another aspect of this disclosure includes the operation input detection device according to any one of the above descriptions.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

Hereinafter, a first embodiment embodying an operation input detection device and a control device for a vehicular opening-closing body on a slide door device will be described with reference to the drawings.

Figure 1:
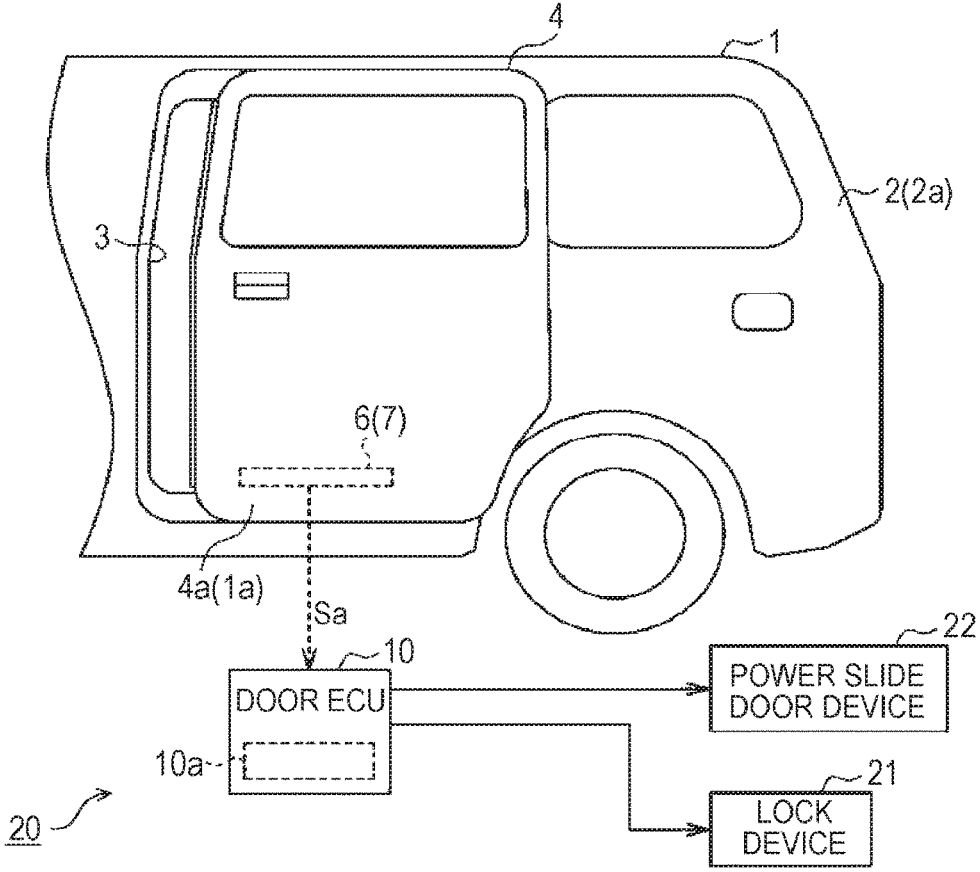
FIG. 1 is a schematic configuration view illustrating a side-surface proximity sensor that is provided in a slide door of a vehicle and a door ECU configuring an operation input detection device together with the side-surface proximity sensor.

As illustrated in FIG. 1, in a vehicle 1 of the embodiment, a slide door 4 as an opening-closing body capable of opening and closing a door opening portion 3 by moving in a longitudinal direction (left-right direction in FIG. 1) of the vehicle is provided at the door opening portion 3 that is provided at a side surface 2a of a vehicle body 2. In addition, the slide door 4 is configured so as to be flush with the side surface 2a of the vehicle body 2 in a fully closed state. Further a proximity sensor (side-surface proximity sensor 6) is provided at a lower side surface portion 4a configuring a lower side surface portion 1a of the vehicle 1 in the slide door 4. Therefore, in the vehicle 1, an operation input for an opening and closing operation of the slide door 4 is detected based on a sensor output Sa of the side-surface proximity sensor 6.

In detail, an electrostatic capacitance sensor 7 is used in the side-surface proximity sensor 6 of the embodiment. A "range surround by a broken line" indicated by the lower side surface portion 4a of the slide door 4 in FIG. 1 indicates a range in which sensor electrodes are incorporated. In addition, the sensor output Sa of the side-surface proximity sensor 6 is input into a door ECU 10. Thus, in the embodiment, the door ECU 10 is configured to function as an operation input detection portion for detecting an operation input with respect to the slide door 4.

That is, the sensor output Sa of the side-surface proximity sensor 6 is changed by approaching and separating (close to and away from) of a detection object from a position at which the side-surface proximity sensor 6 (sensor electrodes of the electrostatic capacitance sensor 7 configuring the side-surface proximity sensor 6) is provided. Thus, the vehicle 1 of the embodiment is configured such that the door ECU 10 detects the operation input of a user based on the sensor output Sa of the side-surface proximity sensor 6 and thereby an operation input detection device 20 is formed.

More specifically, in a case where the door ECU 10 of the embodiment detects the operation input with respect to the slide door 4 based on the sensor output Sa of the side-surface proximity sensor 6, the door ECU 10 causes a lock device 21 provided in the slide door 4 to open, for example, under a condition that security requirements of a so-called electronic key or the like are satisfied. In addition, the vehicle 1 of the embodiment is provided with a power slide door device 22 of which a drive source is a motor (not illustrated). Thus, the door ECU 10 of the embodiment is configured to open and close the slide door 4 by controlling an operation of the power slide door device 22.

Figure 2:
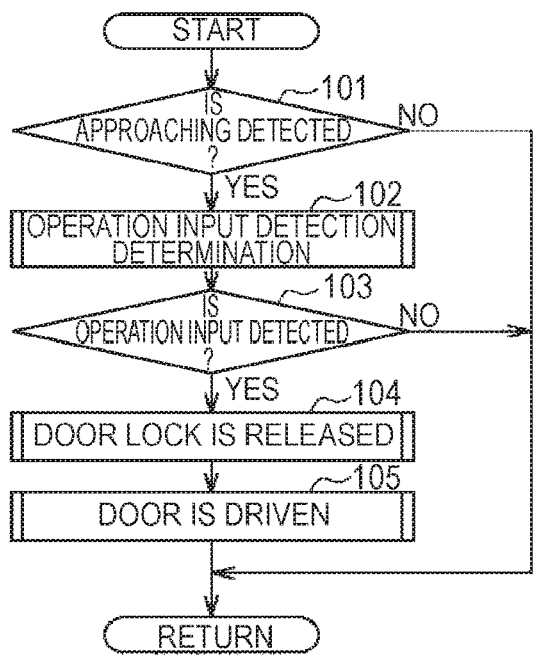
FIG. 2 is a flowchart illustrating an aspect of an operation input detection and door drive control.

Specifically, as illustrated in a flowchart of FIG. 2, the door ECU 10 of the embodiment detects approaching of the detection object with respect to the lower side surface portion 4a of the slide door 4 based on the sensor output Sa of the side-surface proximity sensor 6 (step 101: YES) thereby executing detection determination of the operation input with respect to the slide door 4 (step 102). Therefore, in a case where the operation input is detected with respect to the slide door 4 (step 103: YES), constraint of the slide door 4 by the lock device 21 is released (door lock release, step 104) and drive control of the slide door 4 is executed (step 105).

In addition, the door ECU 10 of the embodiment executes opening drive control of the slide door 4 in order to move the slide door 4 to a full open position in a case where the slide door 4 is at a full closed position. Therefore, in a case where the slide door 4 is at the full open position, the door ECU 10 executes closing drive control of the slide door 4 in order to move the slide door 4 to the full closed position.

Foot Operation Input and Detection Determination

Next, an aspect of a foot operation input that is performed by the user and the detection determination in order to open and close the slide door 4 will be described.

As illustrated in FIGS. 3A to 3F, in the vehicle 1 of the embodiment, a user 30 performing the opening and closing operations of the slide door 4 stands at a side surface position at which the side-surface proximity sensor 6 is provided, that is, in front of the slide door 4 and first of all, inserts a foot tip 31b below the vehicle 1. Next, the user 30 draws the foot tip 31b inserted below the vehicle 1 down on a ground 32 and holds this state for a certain period of time. Further, thereafter, the user 30 pulls the foot tip 31b back on the outside. Therefore, the door ECU 10 of the embodiment is configured to detect the foot operation input with respect to the slide door 4 in a case where it is determined that a series of operations are performed by the user 30 based on the sensor output Sa of the side-surface proximity sensor 6.

Figure 4:
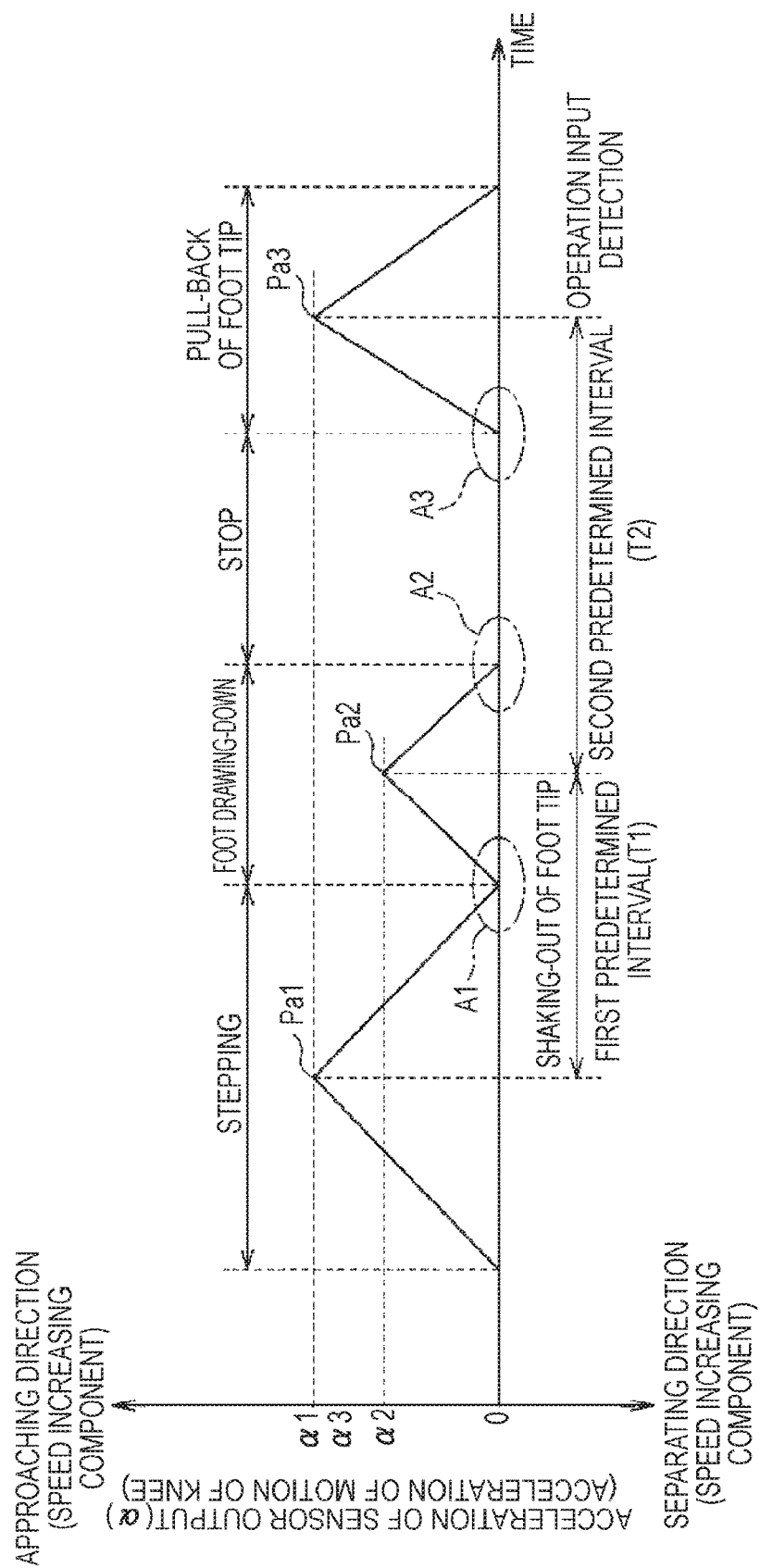
FIG. 4 is an explanatory diagram illustrating a transition of an acceleration of a sensor output by a side-surface proximity sensor during the foot operation input.

In detail, as illustrated in FIG. 4, the door ECU 10 of the embodiment monitors a transition of an acceleration α for the sensor output Sa of the side-surface proximity sensor 6 which is changed by approaching and separating (close to and away from) of the detection object.

That is, the side-surface proximity sensor 6 of the embodiment is configured such that a value (output value) of the sensor output Sa indicates the position of the detection object and a change speed (change amount of an output value per unit time and a speed of an output change) of the sensor output Sa indicates a moving speed of the detection object. Therefore, the acceleration (speed change amount per unit time and an acceleration of the output change) of the sensor output Sa indicates the acceleration of the detection object.

Furthermore, for the acceleration α of the sensor output Sa input from the side-surface proximity sensor 6, the door ECU 10 of the embodiment has a function of selectively extracting a component (speed increasing acceleration) indicating that the detection object increases in speed in an approaching direction to the side-surface proximity sensor 6 and a component indicating that the detection object increases in speed in a direction of separation from the side-surface proximity sensor 6. Therefore, FIG. 4 is configured such that a speed increasing component in the approaching direction is indicated on a plus side (upper side in FIG. 4) and a speed increasing component in the direction of separation is indicated on a minus side (lower side in FIG. 4) for the acceleration α of the sensor output Sa input into the door ECU 10 from the side-surface proximity sensor 6.

That is, when the user 30 inserts the foot tip 31b below the vehicle 1, a knee 31a of the user 30 approaches the lower side surface portion 1a of the vehicle 1. Thus, the operation input detection device 20 of the embodiment is configured such that an acceleration of motion of the knee 31a of the user 30 appears as the acceleration α of the sensor output Sa that is input into the door ECU 10 from the side-surface proximity sensor 6 that is provided at the lower side surface portion 4a of the slide door 4.

More specifically, as illustrated in FIGS. 3 and 4, when the foot tip 31b is inserted below the vehicle 1 in order to perform the opening and closing operations of the slide door 4, the user 30 moves a foot 31 toward the vehicle 1 positioned in front of the user 30 in a form in which the knee 31a protrudes (see FIG. 3B). Thus, the foot tip 31b is inserted below the vehicle 1 in a form in which the foot tip 31b is shaken forward about the knee 31a as a pivot point (see FIG. 3C).

In this case, the acceleration α of the sensor output Sa input into the door ECU 10 from the side-surface proximity sensor 6 increases in accordance with the motion of the knee 31a of the user 30 protruding the vehicle 1 side. In addition, the acceleration α of the sensor output Sa is attenuated by an decrease in the motion of the knee 31a that is the pivot point during the shaking operation of the foot tip 31b. Therefore, in the side-surface proximity sensor 6, a first peak Pa1 appears in a transition waveform of the acceleration α of the sensor output Sa.

Figure 3A:
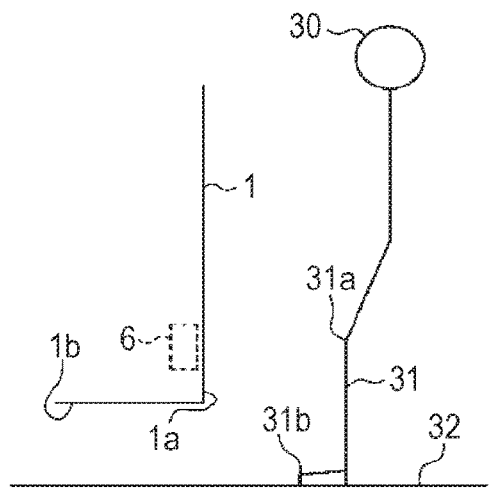
FIGS. 3A to 3F are procedure explanatory views of a foot operation input performed by a user.
Figure 3B:
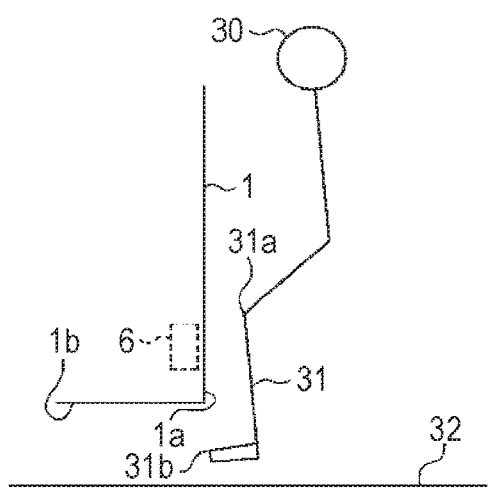
Figure 3C:
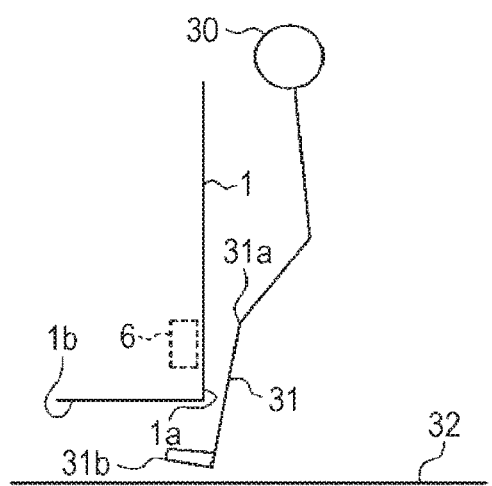
Figure 3D:
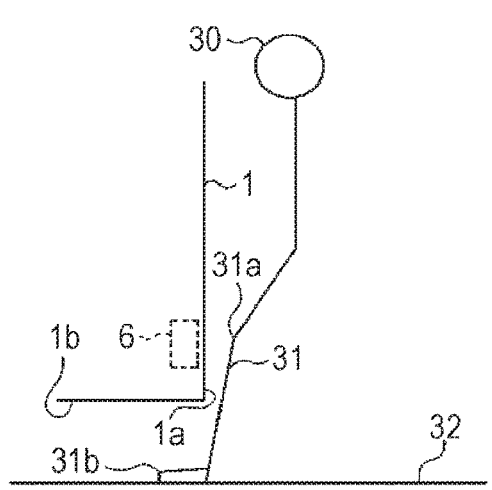
Figure 3E:
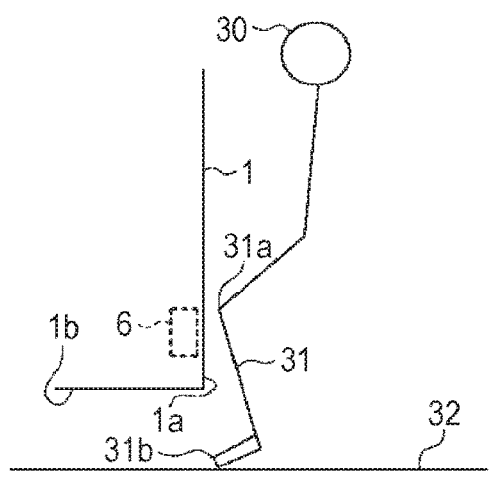
Figure 3F:
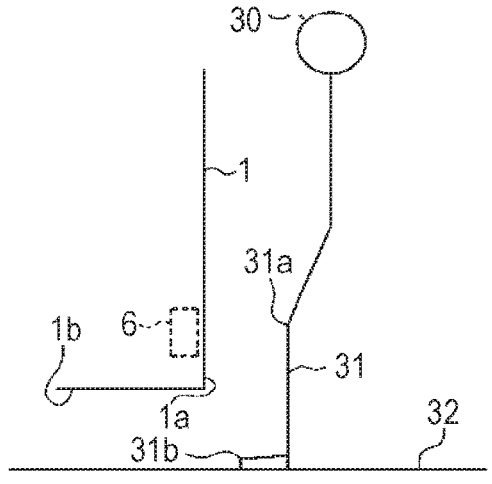

In addition, the user 30 draws the foot tip 31b inserted below the vehicle 1 down on the ground 32 and thereby the knee 31a of the user 30 approaches again the lower side surface portion 1a of the vehicle 1 in which the side-surface proximity sensor 6 is provided (see FIG. 3D). Therefore, a second peak Pa2 indicating the acceleration of the motion of the knee 31a in the foot drawing-down operation appears in the acceleration α of the sensor output Sa in the side-surface proximity sensor 6.

That is, the acceleration α of the sensor output Sa input into the door ECU 10 from the side-surface proximity sensor 6 increases again in accordance with the motion of the knee 31a in the foot drawing-down operation of the user 30. Thus, the foot tip 31b of the user 30 is landed on the ground 32 and the motion of the knee 31a is decreased, and thereby the acceleration α of the sensor output Sa is attenuated.

In addition, the position of the knee 31a is not moved (stop state) while the user 30 holds a state where the foot tip 31b is drawn down on the ground 32. Therefore, the acceleration α of the sensor output Sa input into the door ECU 10 from the side-surface proximity sensor 6 is substantially zero ($|\alpha|\cong 0$) while a state where the foot tip 31b is drawn down on the ground 32 is held. Furthermore, thereafter, the user 30 performs an operation in which the foot tip 31b inserted below the vehicle 1 is pulled back on the outside and thereby the knee 31a of the user 30 approaches again the lower side surface portion 1a of the vehicle 1 in which the side-surface proximity sensor 6 is provided (see FIG. 3E). Therefore, a third peak Pa3 appears in the transition waveform of the acceleration α of the sensor output Sa in the side-surface proximity sensor 6.

That is, when the foot tip 31b inserted below the vehicle 1 is pulled back on the outside, the user 30 bends the knee 31a and floats the foot tip 31b drawn down on the ground 32, thereby performing the pull-back operation. In this case, the acceleration α of the sensor output Sa input into the door ECU 10 from the side-surface proximity sensor 6 increases in accordance with the motion of the knee 31a approaching the vehicle 1 side according to the pull-back operation. Furthermore, the knee 31a of the user 30 moves away from the vehicle 1 by causing the foot 31 to return to an original position by a shaking-back operation of the foot tip 31b. Thus, the acceleration α of the sensor output Sa is attenuated in accordance with the motion of the knee 31a away from the vehicle 1 side.

The door ECU 10 of the embodiment determines whether or not the acceleration α of the sensor output Sa has a transition having characteristics that are seen during execution of such a foot operation input when a change indicating the detection object approaching the sensor output Sa of the side-surface proximity sensor 6. Therefore, it is possible to accurately perform the operation input detection determination (see step 102 in FIG. 2).

In addition, the transition waveform for the acceleration α of the sensor output Sa input into the door ECU 10 from the side-surface proximity sensor 6 illustrated in FIG. 4 is linearly and schematically illustrated in order to highlight characteristic points during the foot operation input described above and an actual waveform is rounded including fine increase and decrease. In addition, there is a variation due to individual differences and the acceleration α of the sensor output Sa may be shifted in the direction of separation (lower side in FIG. 4) depending on the user 30 at a region A1 indicating the acceleration of the motion of the knee 31a in a shaking-out operation of the foot tip 31b, a region A2 after the foot drawing-down operation, or a region A3 before the pull-back operation of the foot tip 31b in FIG. 4.

However, in a case where the user 30 performs correctly the foot operation input, the first to third peaks Pa1 to Pa3 indicating the acceleration of the motion of the knee 31a in the approaching direction (upper side in FIG. 4) described above appear in the transition waveform of the acceleration α of the sensor output Sa in the side-surface proximity sensor 6. That is, in FIG. 4, the first to third peaks Pa1 to Pa3 indicate the peaks of the speed increasing component in the approaching direction for the acceleration α of the sensor output Sa. Thus, in a case where the first to third peaks Pa1 to Pa3 are detected correctly, the door ECU 10 of the embodiment is configured to determine that the operation input of the user 30 is performed for the opening and closing operations of the slide door 4.

Figure 5:
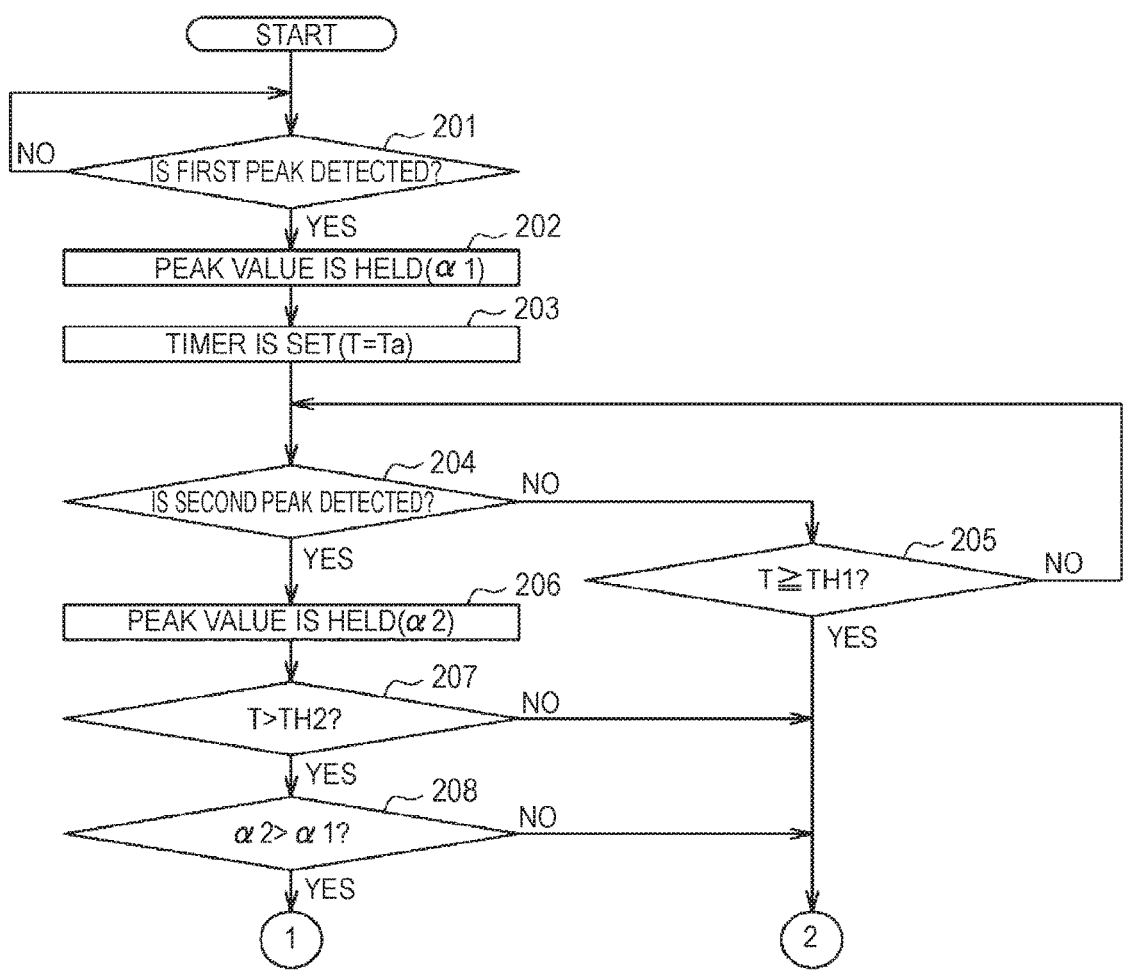
FIG. 5 is a flowchart illustrating a processing procedure of an operation input detection determination.
Figure 6:
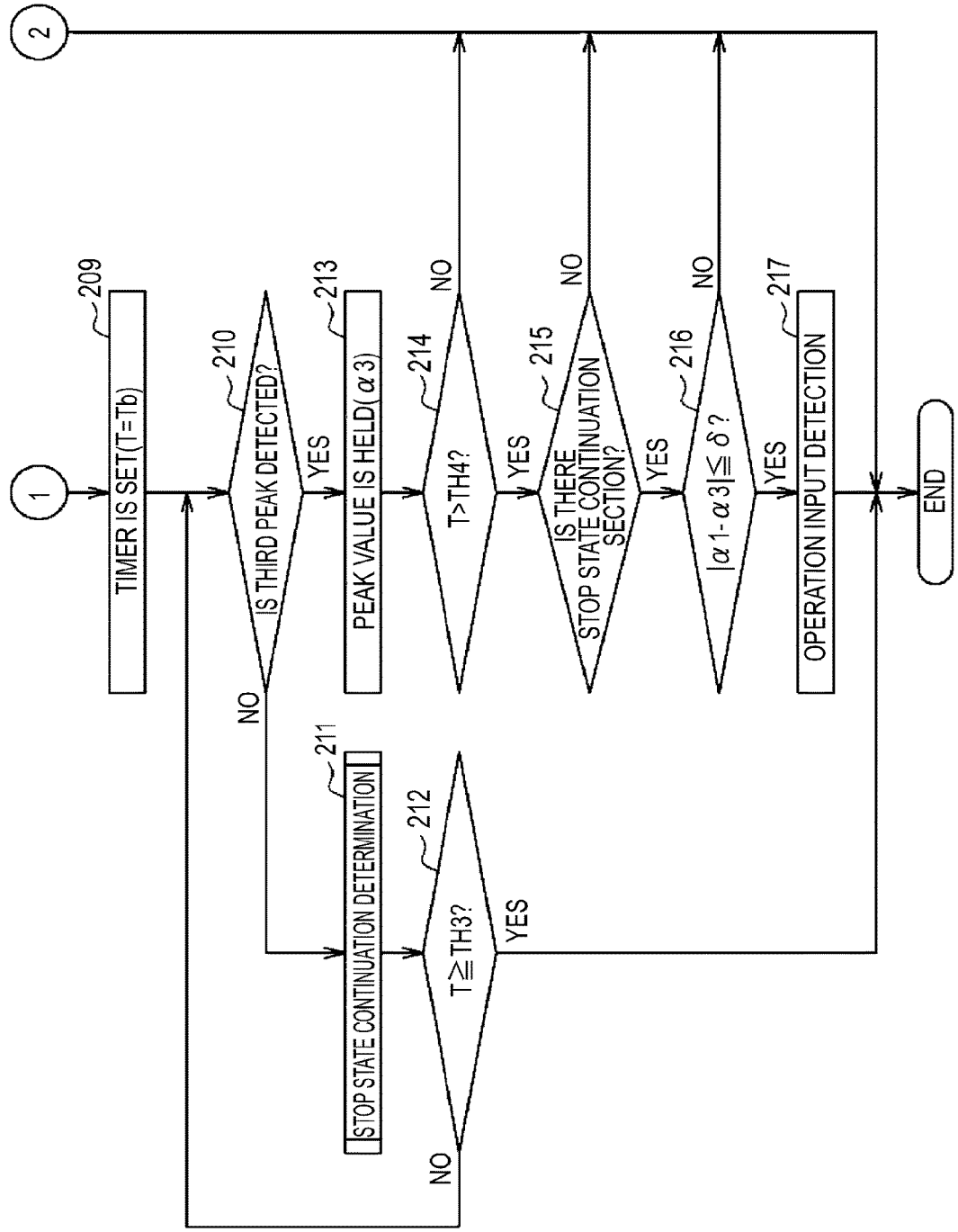
FIG. 6 is a flowchart illustrating a processing procedure of the operation input detection determination.

More specifically, as illustrated in flowcharts of FIGS. 5 and 6, first, the door ECU 10 of the embodiment determines whether or not the first peak Pa1 in the approaching direction is detected in the acceleration α of the sensor output Sa input into the door ECU 10 from the side-surface proximity sensor 6 in the operation input detection determination (step 201).

In addition, the door ECU 10 of the embodiment holds the acceleration α of the sensor output Sa detected in the previous detection period in a storage region 10a (see FIG. 1) as a previous value of the acceleration α of the sensor output Sa. Thus, a peak of the acceleration α of the sensor output Sa is detected by comparing a current value of the acceleration α of the sensor output Sa detected in a current detection period with the previous value of the acceleration α of the sensor output Sa stored in the storage region 10a while the previous value of the acceleration α of the sensor output Sa is updated over a plurality of continuous detection periods.

In addition, in a case where it is determined that the first peak Pa1 is detected (step 201: YES), the door ECU 10 holds a peak value α1 of the acceleration α detected in the first peak Pa1 in the storage region 10a (step 202). Thus, a timer for counting is set in order to measure an elapsed time T from the first peak Pa1 (T=Ta, step 203). In addition, in step 203, an initial value Ta of the elapsed time T that is set at the timer for counting is a calculation time required to determine the detection of the first peak Pa1 after the acceleration α of the sensor output Sa reaches the peak value α1 in the first peak Pa1.

Next, the door ECU 10 of the embodiment determines whether or not the second peak Pa2 in the same approaching direction as that of the first peak Pa1 is detected in the acceleration α of the sensor output Sa input from the side-surface proximity sensor 6 (step 204). Thus, it is determined whether or not the elapsed time T from the first peak Pa1 reaches a first predetermined time TH1 that is set in advance (step 205) until the second peak Pa2 is detected (step 204: NO).

In a case where it is determined that the second peak Pa2 is detected (step 204: YES) before reaching the first predetermined time TH1 (T<TH1, step 205: NO), the door ECU 10 of the embodiment subsequently holds a peak value α2 of the acceleration α detected in the second peak Pa2 in the storage region 10a (step 206). Thus, it is determined whether or not the elapsed time T from the first peak Pa1 to the second peak Pa2 exceeds a second predetermined time TH2 that is set in advance (step 207).

That is, during the foot operation input, a time required until the user 30 inserts the foot tip 31b below the vehicle 1 and puts the foot tip 31b down on the ground 32 falls substantially in a certain range even taking into account individual differences of the user 30. Taking this point into consideration, in the operation input detection device 20 of the embodiment, in a case where the foot operation input of the user 30 is performed correctly, a range of a standard elapsed time from the first peak Pa1 to the second peak Pa2 is set in advance as a first predetermined interval T1 (see FIG. 4). Thus, the first and second predetermined times TH1 and TH2 are respectively an upper limit value and a lower limit value of the first predetermined interval T1.

That is, in the door ECU 10 of the embodiment, one condition for detecting the foot operation input of the user 30 includes that it is determined that the elapsed time T from the first peak Pa1 does not reach the first predetermined time TH1 (T<TH1, step 205: NO) and it is determined that the elapsed time T exceeds the second predetermined time TH2 (T>TH2, step 207: YES). Therefore, in a case where it is determined that the second peak Pa2 in the same approaching direction as that of the first peak Pa1 is detected at the first predetermined interval T1 after the first peak Pa1 is detected in the acceleration α of the sensor output Sa input from the side-surface proximity sensor 6, the operation input detection determination is continued.

Next, the door ECU 10 of the embodiment determines whether or not the peak value α2 of the acceleration α detected in the second peak Pa2 is smaller than the peak value α1 of the acceleration α detected in the first peak Pa1 (step 208).

That is, the acceleration of the motion of the knee 31a in an operation in which the foot tip 31b inserted below the vehicle 1 is drawn down on the ground 32 (see FIGS. 3C and 3D, a foot drawing-down operation) is smaller than the acceleration of the motion of the knee 31a in an operation in which the foot 31 is stepped on the vehicle 1 side (see FIGS. 3A and 3B, a step operation) when the foot tip 31b is inserted below the vehicle 1. Thus, in a case where the peak value α2 of the acceleration α detected in the second peak Pa2 is smaller than the peak value α1 of the acceleration α detected in the first peak Pa1 (α2<α1, step 208: YES), the door ECU 10 of the embodiment determines that one condition for detecting the foot operation input is satisfied and is configured to continue the operation input detection determination.

In addition, in step 205, in a case where the elapsed time T from the first peak Pa1 reaches the first predetermined time TH1 that is set in advance (T≥Th1, step 205: YES), the door ECU 10 of the embodiment does not execute the processes following step 206. In addition, in step 207, in a case where the elapsed time T from the first peak Pa1 does not exceed the second predetermined time TH2 that is set in advance (T≤TH2, step 207: NO), the door ECU 10 of the embodiment does not execute the processes following step 208. Thus, in step 208, in a case where the peak value α2 of the acceleration α detected in the second peak Pa2 is equal to or greater than the peak value α1 of the acceleration α detected in the first peak Pa1 (α2≥α1, step 208: NO), the door ECU 10 of the embodiment does not execute processes following step 209 described below.

Next, the door ECU 10 of the embodiment sets the timer for counting to measure the elapsed time T from the second peak Pa2 (T=Tb, step 209). In addition, in step 209, an initial value Tb of the elapsed time T that is set at the timer for counting is a calculation time required to determine the detection of the second peak Pa2 after the acceleration α of the sensor output Sa reaches the peak value α2 in the second peak Pa2. Thus, the door ECU 10 of the embodiment determines whether or not the third peak Pa3 in the same approaching direction as those of the first and second peaks Pa1 and Pa2 is detected in the acceleration α of the sensor output Sa input from the side-surface proximity sensor 6 (step 210).

In addition, the door ECU 10 of the embodiment determines whether or not the acceleration α of the sensor output Sa input from the side-surface proximity sensor 6 indicates the stop state of the detection object and the stop state continues until the third peak Pa3 is detected (step 210: NO) (stop state continuation determination, step 211).

Figure 7:
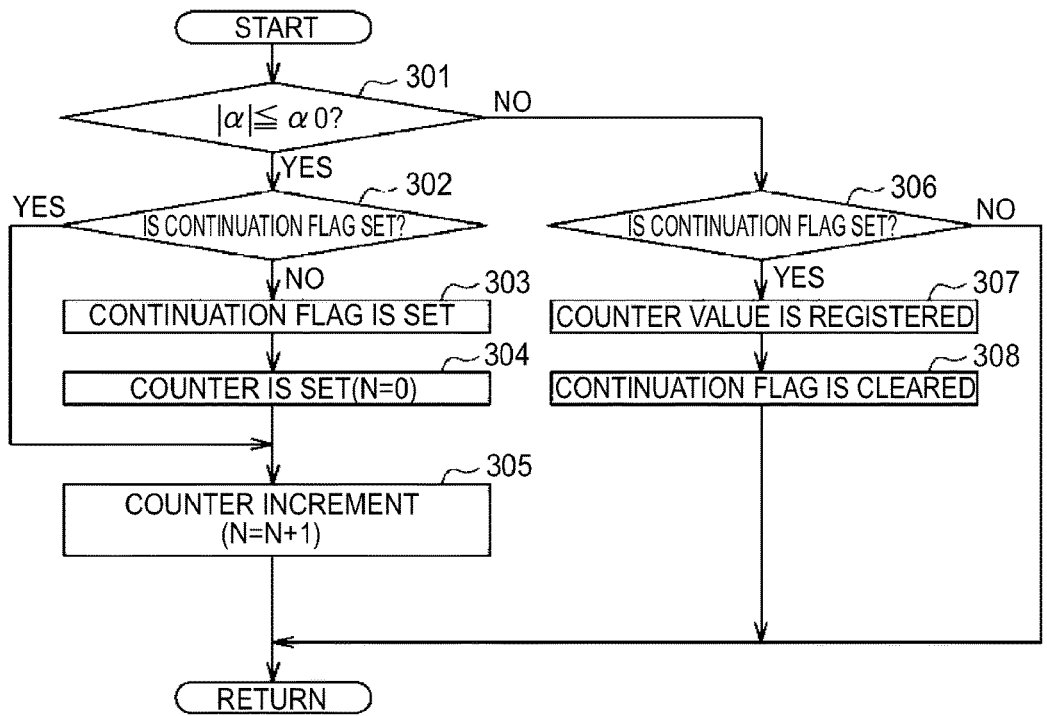
FIG. 7 is a flowchart illustrating a stop state continuation determination.

Specifically, as illustrated in a flowchart of FIG. 7, the door ECU 10 of the embodiment firstly determines whether or not the acceleration α of the sensor output Sa input from the side-surface proximity sensor 6 is equal to or less than a predetermined threshold α0 in the stop state continuation determination (step 301). Furthermore, in a case where it is determined that the acceleration α of the sensor output Sa is equal to or less than the predetermined threshold α0 (|α|≤α0, step 301: YES), the door ECU 10 subsequently determines whether or not a continuation flag indicating that a state where the acceleration α of the sensor output Sa is equal to or less than the predetermined threshold α0 continues is set (step 302). Thus, in a case where the continuation flag is not set (step 302: NO), the continuation flag is set (step 303) and a counter measuring for the number of times is set (N=0, step 304).

In addition, in step 302, in a case where the continuation flag is set already (step 302: YES), the door ECU 10 does not execute the processes of step 303 and step 304. Thus, it is configured to perform increment of the counter thereof (N=N+1, step 305).

Furthermore, in step 301, in a case where it is determined that the acceleration α of the sensor output Sa input from the side-surface proximity sensor 6 is greater than the predetermined threshold α0 (|α|>α0, step 301: NO), the door ECU 10 of the embodiment determines whether or not the continuation flag is set (step 306). Thus, in step 306, in a case where the continuation flag is set (step 306: YES), a counter value N indicating the number of continuations in which it is determined that the acceleration α of the sensor output Sa is equal to or less than the predetermined threshold α0 is registered in the storage region 10a (step 307) and the continuation flag is cleared (step 308).

In addition, as illustrated in the flowchart of FIG. 6, the door ECU 10 of the embodiment determines whether or not the elapsed time T from the second peak Pa2 reaches a third predetermined time TH3 that is set in advance together with the stop state continuation determination (see FIG. 7) in step 211 until the third peak Pa3 is detected (step 210: NO) (step 212).

Furthermore, in a case where it is determined that the third peak Pa3 is detected (step 210: YES) before reaching the third predetermined time TH3 (T<TH3, step 212: NO), the door ECU 10 of the embodiment subsequently holds a peak value α3 of the acceleration α detected in the third peak Pa3 in the storage region 10a (step 213). Thus, it is determined whether or not the elapsed time T from the second peak Pa2 to the third peak Pa3 exceeds a fourth predetermined time TH4 that is set in advance (step 214).

That is, as illustrated in FIG. 4, in the operation input detection device 20 of the embodiment, in a case where the foot operation input of the user 30 is performed correctly, the range of the standard elapsed time from the second peak Pa2 to the third peak Pa3 is set as a second predetermined interval T2 in advance. In addition, in the embodiment, the second predetermined interval T2 is held in a state where the user 30 draws the foot tip 31b inserted below the vehicle 1 down on the ground 32 and then, is set based on a time required until the foot tip 31b is pulled back on the outside of the vehicle 1. Thus, the third and fourth predetermined times TH3 and TH4 are respectively an upper limit value and a lower limit value of the second predetermined interval T2.

That is, in the door ECU 10 of the embodiment, one condition for detecting the foot operation input of the user 30 includes that it is determined that the elapsed time T from the second peak Pa2 does not reach the third predetermined time TH3 (T<TH3, step 212: NO) and it is determined that the elapsed time T exceeds the fourth predetermined time TH4 (T>TH4, step 214: YES). Therefore, in a case where it is determined that the third peak Pa3 in the same approaching direction as those of the first and second peaks Pa1 and Pa2 is detected at the second predetermined interval T2 after the second peak Pa2 is detected in the acceleration α of the sensor output Sa input from the side-surface proximity sensor 6, the operation input detection determination is continued.

In addition, the door ECU 10 determines whether or not there is a section in which the acceleration α of the sensor output Sa is a small value that continuously indicates the stop state of the detection object (step 215) until the third peak Pa3 is detected (step 210: YES) after the second peak Pa2 is detected (step 204: YES).

Specifically, the door ECU 10 of the embodiment reads the counter value N (see FIG. 7, step 307) that is registered in the storage region 10a by executing the stop state continuation determination of step 211 in a stop state continuation section determination of step 215. Thus, as a result indicated in the counter value N, that is, in a case where it is determined that there is a section in which the acceleration α of the sensor output Sa is continuously equal to or less than the predetermined threshold α0 indicating the stop state of the detection object based on the number of continuations in which it is determined that the acceleration α of the sensor output Sa is equal to or less than the predetermined threshold α0 (step 215: YES), the operation input detection determination is continued.

Furthermore, the door ECU 10 of the embodiment determines whether or not a difference (|α1−α3|) between the peak value α1 of the acceleration α detected in the first peak Pa1 and the peak value α3 of the acceleration α detected in the third peak Pa3 is equal to or less than a predetermined threshold δ (step 216).

That is, the acceleration of the motion of the knee 31a in the operation (see FIGS. 3D and 3E, the pull-back operation) in which the user 30 pulls the foot tip 31b inserted below the vehicle 1 back on the outside is substantially equal to the acceleration of the motion of the knee 31a in the operation (see FIGS. 3A and 3B, the step operation) in which the user 30 moves the foot 31 toward the vehicle 1 so as to insert the foot tip 31b below the vehicle 1. Thus, in a case where the difference between the peak value α1 of the acceleration α detected in the first peak Pa1 and the peak value α3 of the acceleration α detected in the third peak Pa3 is equal to or less than a predetermined threshold δ (|α1−α3|≤δ, step 216: YES), the door ECU 10 of the embodiment determines that the foot operation input is performed by the user 30 (step 217).

In addition, in step 212, in a case where the elapsed time T from the second peak Pa2 reaches the third predetermined time TH3 that is set in advance (T≥TH3, step 212: YES), the door ECU 10 of the embodiment does not execute processes of step 213 to step 217. In addition, in step 214, in a case where the elapsed time T from the second peak Pa2 does not exceed the fourth predetermined time TH4 that is set in advance (T≤TH4, step 214: NO), the door ECU 10 of the embodiment does not execute the processes of step 215 to step 217. Furthermore, in step 215, in a case where it is determined that there is not a section in which the acceleration α of the sensor output Sa input from the side-surface proximity sensor 6 is continuously equal to or less than the predetermined threshold α0 indicating the stop state of the detection object (step 215: NO), the door ECU 10 of the embodiment does not execute the process of step 216 and step 217. Thus, in step 216, in a case where the difference between the peak value α1 of the acceleration α detected in the first peak Pa1 and the peak value α3 of the acceleration α detected in the third peak Pa3 is greater than the predetermined threshold δ (|α1−α3|>δ, step 216: NO), the door ECU 10 of the embodiment does not execute the process of step 217.

As described above, in the embodiment, it is possible to obtain the following advantages.

(1) The sensor output Sa of the side-surface proximity sensor 6 provided at the lower side surface portion 1a of the vehicle 1 is input into the door ECU 10 configuring the operation input detection portion of the operation input detection device 20. Then, the door ECU 10 determines that the operation input is performed by the user 30 in a case where when a change indicating approaching of the detection object is detected in the sensor output Sa of the side-surface proximity sensor 6, and after the first peak Pa1 is detected in the acceleration α of the sensor output Sa, the second peak Pa2 is detected in the same direction as that of the first peak Pa1 at the first predetermined interval T1.

That is, when the user 30 performs the operation of inserting the foot tip 31b below the vehicle 1, the knee 31a of the user 30 approaches the lower side surface portion 1a of the vehicle 1 in which the side-surface proximity sensor 6 is provided in two stages. Therefore, in the side-surface proximity sensor 6, the first and second peaks Pa1 and Pa2 appear at a certain interval in the same proximity direction in the acceleration α of the sensor output Sa indicating the acceleration of the motion of the knee 31a of the user 30.

Therefore, in the configuration described above, even if the user 30 does not perform the operation which brings the foot tip 31b near the lower surface portion 1b (see FIG. 3) of the vehicle 1, it is possible to accurately detect the operation input from the foot 31. Therefore, it is possible to perform the operation input with a stable posture in which the foot tip 31b inserted below the vehicle 1 is drawn down on the ground 32.

In addition, there is an advantage that it is possible to ensure high detection accuracy with one side-surface proximity sensor 6 provided at the lower side surface portion 1a of the vehicle 1. That is, in the side-surface proximity sensor 6, during the foot operation input, in a case where an detection object other than the foot 31 of the user 30 performing the operation input approaches, for example, in a case where a foot of a person simply approaches the lower side surface portion 1a of the vehicle 1 in which the side-surface proximity sensor 6 is provided, it is possible to prevent error detection by detecting two characteristic peaks appearing in the acceleration α of the sensor output Sa. In addition, even in a case where detection objects (for example, plants, small animals, children's toys, and the like) other than the foot tip 31b of the user 30 are positioned below the vehicle 1, erroneous detection does not occur due to those detection objects. Thus, since it is configured to monitor the acceleration α of the sensor output Sa, even in a state where dirt such as mud, plants, or the like, rain water, and the like are attached to the vehicle 1, it is possible to detect the operation input from the user 30 based on the sensor output Sa of the side-surface proximity sensor 6.

(2) The door ECU 10 determines that the operation input is performed by the user 30 under a condition that the peak value α2 of the acceleration α detected in the second peak Pa2 is smaller than the peak value α1 of the acceleration α detected in the first peak Pa1 (α2<α1).

That is, when the user 30 inserts the foot tip 31b below the vehicle 1, the acceleration of the motion of the knee 31a in the step operation of the foot 31 on the vehicle 1 side in the form in which the knee 31a protrudes appears in the acceleration α of the sensor output Sa in the side-surface proximity sensor 6 as the first peak Pa1. In addition, the acceleration of the motion of the knee 31a in the operation in which the foot tip 31b inserted below the vehicle 1 is drawn down on the ground 32 appears in the acceleration α of the sensor output Sa as the second peak Pa2. Thus, the acceleration of the motion of the knee 31a in the foot drawing-down operation is smaller than the acceleration of the motion of the knee 31a in the step operation when inserting the foot tip 31b below the vehicle 1. Therefore, in the embodiment, it is possible to further accurately detect the operation input of the user 30.

(3) The door ECU 10 determines that the operation input is performed by the user 30 under a condition that a state where the acceleration α of the sensor output Sa is equal to or less than the predetermined threshold α0 (|α|≤α0) continues after the second peak Pa2 is detected.

In the configuration described above, it is possible to set that the user 30 holds (stops) the foot tip 31b inserted below the vehicle 1 in a state of being drawn down on the ground 32 for a certain time as one element of the foot operation input. Therefore, it is possible to further accurately detect the operation input of the user 30.

(4) The door ECU 10 determines that the operation input is performed by the user 30 under a condition that the third peak Pa3 in the same direction as those of the first and second peaks Pa1 and Pa2 is detected at the second predetermined interval T2 that is set in advance after the second peak Pa2 is detected.

That is, when the foot tip 31b inserted below the vehicle 1 is pulled back on the outside, the user 30 bends the knee 31a and performs the pull-back operation of the foot tip 31b drawn down on the ground 32. Thus, in this case, the third peak Pa3 indicating the acceleration of the motion of the knee 31a approaching the lower side surface portion 1a of the vehicle 1 in which the side-surface proximity sensor 6 is provided appears again in the acceleration α of the sensor output Sa in the side-surface proximity sensor 6.

Therefore, in the configuration described above, it is possible to further accurately detect the operation input of the user 30. In addition, after the user 30 pulls the foot tip 31b inserted below the vehicle 1 back on the outside, the slide door 4 performs the opening and closing operations. Therefore, even if the slide door 4 has a configuration in which the opening and closing operations are performed in an aspect in which the slide door 4 protrudes to the outside of the vehicle 1, the user 30 can wait for completion of the opening and closing operations at a safe position away from the slide door 4.

(5) The door ECU 10 determines that the operation input is performed by the user 30 under a condition that a difference between the peak value α1 of the acceleration α detected in the first peak Pa1 and the peak value α3 of the acceleration α detected in the third peak Pa3 is equal to or less than the predetermined threshold δ (|α1−α3|≤δ).

That is, the acceleration of the motion of the knee 31a in the pull-back operation of the foot tip 31b inserted below the vehicle 1 on the outside performed by the user 30 is substantially equal to the acceleration of the motion of the knee 31a in the step operation of the foot 31 on the vehicle 1 side performed by the user 30 to inert the foot tip 31b below the vehicle 1. Therefore, in the configuration, it is possible to further accurately detect the operation input of the user 30.

Second Embodiment

Hereinafter, a second embodiment embodying an operation input detection device and a control device for a vehicular opening-closing body on a back door device will be described with reference to the drawings. In addition, for the sake of convenience of description, the same reference numerals are given to the same configurations as those of the first embodiment and the description will be omitted.

Figure 8:
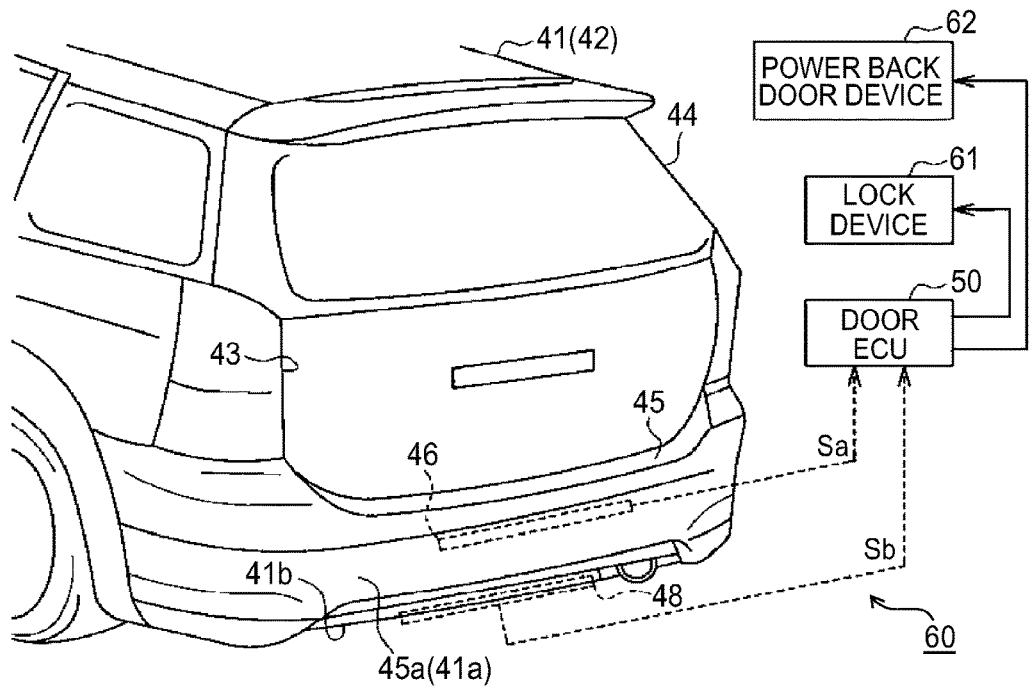
FIG. 8 is a schematic configuration view illustrating a side-surface proximity sensor and a lower-surface proximity sensor which are provided in the vicinity of a back door of a vehicle, and a door ECU configuring an operation input detection device together with both the proximity sensors in a second embodiment.

As illustrated in FIG. 8, in a vehicle 41 of the embodiment, a so-called flip-up type back door 44 performing the opening and closing operations about an upper end portion as a rotation center is provided at a door opening portion 43 that is formed in the rear end portion of a vehicle body 42. In addition, a side-surface proximity sensor 46 similar to the side-surface proximity sensor 6 provided in the lower side surface portion 4a of the slide door 4 in the first embodiment is provided below the back door 44 in a rear side surface portion 45a of a bumper 45 configuring a lower side surface portion 41a of the vehicle 41. Furthermore, in the vehicle 41 of the embodiment, a lower-surface proximity sensor 48 is provided below the side-surface proximity sensor 46 in a position that is a lower surface portion 41b of the vehicle 41. In addition, in the embodiment, the same electrostatic capacitance sensor 7 as that of the side-surface proximity sensor 46 is also used for the lower-surface proximity sensor 48. Thus, in the vehicle 41 of the embodiment, an operation input for the opening and closing operations of the slide door 4 is detected based on each of sensor outputs Sa and Sb of the side-surface proximity sensor 46 and the lower-surface proximity sensor 48.

That is, also in the vehicle 41 of the embodiment, each of the sensor outputs Sa and Sb of the side-surface proximity sensor 46 and the lower-surface proximity sensor 48 is input into a door ECU 50. Thus, the door ECU 50 functions as an operation input detection portion for detecting the operation input with respect to the back door 44 and thereby an operation input detection device 60 is formed.

Specifically, the door ECU 50 of the embodiment also causes a lock device 61 provided in the back door 44 to perform the opening and closing operations under a condition that predetermined security requirements are satisfied in a case where the operation input is detected with respect to the back door 44 based on each of the sensor outputs Sa and Sb of the side-surface proximity sensor 46 and the lower-surface proximity sensor 48. In addition, in the vehicle 41 of the embodiment, a power back door device 62 using a motor (not illustrated) as a drive source is provided. Thus, the door ECU 50 of the embodiment is configured to cause the back door 44 to perform the opening and closing operations by controlling an operation of the power back door device 62.

In addition, the door ECU 50 of the embodiment executes opening drive control in a case where the back door 44 is in a full-closed state. Thus, in a case where the back door 44 is in a full-open state, closing drive control is executed.

Foot Operation Input and Detection Determination

Next, an aspect of a foot operation input that is performed by the user and the detection determination in order to open and close the slide door 44 will be described.

As illustrated in FIGS. 9A to 9F, in the vehicle 41 of the embodiment, the user 30 performing the opening and closing operations of the back door 44 executes the same foot operation input as that of the vehicle 1 in the first embodiment.

That is, the user 30 inserts the foot tip 31b below the vehicle 41, draws the foot tip 31b down on the ground 32, and then pulls the foot tip 31b back on the outside of the vehicle 41 after stopping the foot tip 31b for a certain period of time. Thus, the door ECU 50 of the embodiment is configured to detect the foot operation input with respect to the back door 44 in a case where it is determined that a series of operations are performed by the user 30 based on each of the sensor outputs Sa and Sb of the side-surface proximity sensor 46 and the lower-surface proximity sensor 48.

Figure 10:
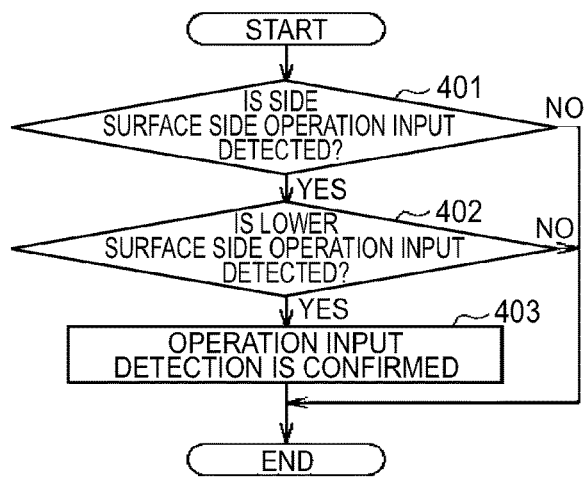
FIG. 10 is a flowchart illustrating a processing procedure of an operation input detection determination in the second embodiment.

Specifically, the door ECU 50 of the embodiment executes the operation input detection determination based on the sensor output Sb of the lower-surface proximity sensor 48 in association with the operation input detection determination of the side surface side together with the operation input detection determination based on the sensor output Sa of the side-surface proximity sensor 46 (operation input detection determination of the lower surface side). Thus, as illustrated in a flowchart of FIG. 10, in both the operation input detection determination of the side surface side and the operation input detection determination of the lower surface side, in a case where it is determined that the foot operation input of the user 30 is performed (step 401: YES and step 402: YES), the determination of the foot operation input detection is confirmed (step 403).

Figure 11:
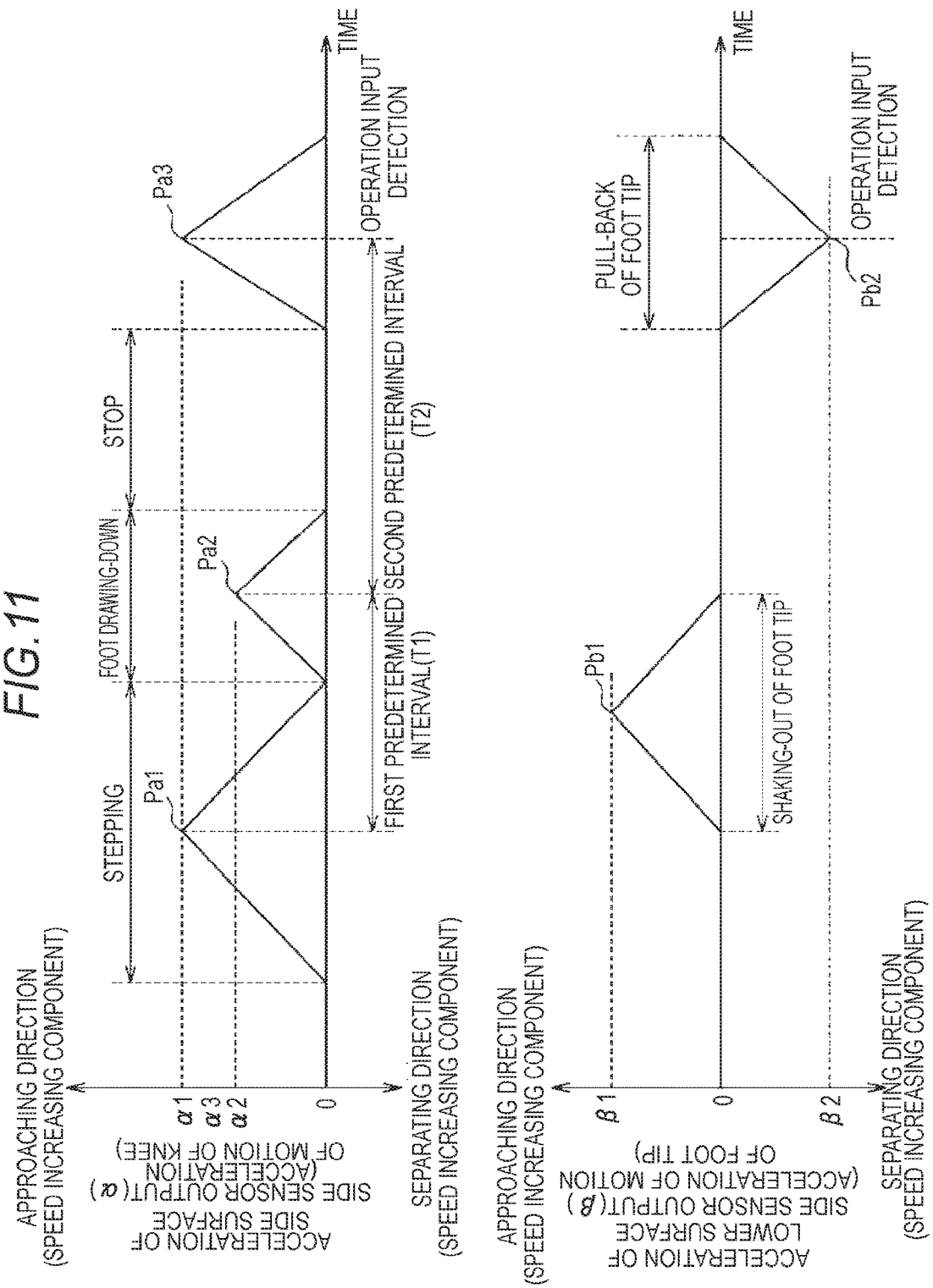
FIG. 11 is an explanatory diagram illustrating a transition of an acceleration of each sensor output by a side-surface proximity sensor and a lower-surface proximity sensor during the foot operation input.

More specifically, as illustrated in FIG. 11, the door ECU 50 of the embodiment executes the same determination process as the operation input detection determination in the first embodiment in the operation input detection determination of the side surface side (see FIGS. 5 and 6).

That is, also in the vehicle 41 of the embodiment, the side-surface proximity sensor 46 is configured such that the acceleration of the motion of the knee 31a of the user 30 performing the foot operation input appears in the acceleration α of the sensor output Sa. Thus, the door ECU 50 of the embodiment is configured to execute the operation input detection determination of the side surface side by detecting the first to third peaks Pa1 to Pa3 appearing in a transition waveform of the acceleration α of the sensor output Sa during the foot operation input from the user 30.

In addition, in the vehicle 41 of the embodiment, the lower-surface proximity sensor 48 is configured such that the acceleration of the motion of the foot tip 31b of the user 30 performing the foot operation input appears in an acceleration β of the sensor output Sb. Thus, the door ECU 50 of the embodiment is configured such that the operation input detection determination of the lower surface side is executed by detecting a first lower surface side peak Pb1 appearing in the acceleration β of the sensor output Sb when the user 30 inserts the foot tip 31b below the vehicle 41 and a second lower surface side peak Pb2 appearing when the user 30 pulls the foot tip 31b back to the outside of the vehicle 41 during the foot operation input.

In addition, the door ECU 50 of the embodiment also has a function of selectively extracting a component (speed increasing acceleration) indicating that the detection object increases in speed in an approaching direction to the side-surface proximity sensor 46 and a component indicating that the detection object increases in speed in a direction of separation from the side-surface proximity sensor 46 for the acceleration α of the sensor output Sa input from the side-surface proximity sensor 46. Furthermore, the door ECU 50 has a function of selectively extracting a component (speed increasing acceleration) indicating that the detection object increases in speed in an approaching direction to the lower-surface proximity sensor 48 and a component indicating that the detection object increases in speed in a direction of separation from the lower-surface proximity sensor 48 also for the sensor output Sb input from the lower-surface proximity sensor 48. Thus, FIG. 11 is configured such that the speed increasing component in the approaching direction is indicated on a plus side (upper side in FIG. 11) and the speed increasing component in the direction of separation is indicated on a minus side (lower side in FIG. 11) for the accelerations α and β of the sensor outputs Sa and Sb input into the door ECU 50 from the side-surface proximity sensor 46 and the lower-surface proximity sensor 48.

Figure 9A:
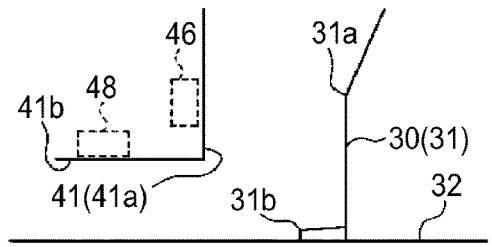
FIGS. 9A to 9F are procedure explanatory views of a foot operation input performed by a user.
Figure 9B:
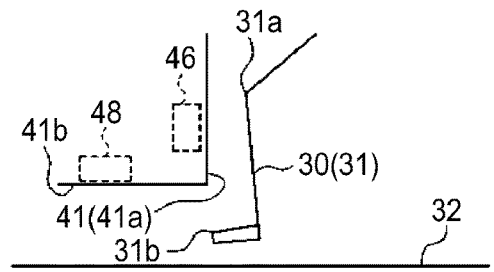
Figure 9C:
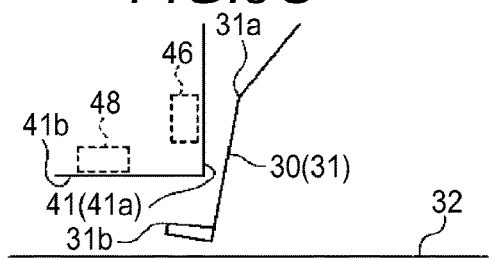
Figure 9D:
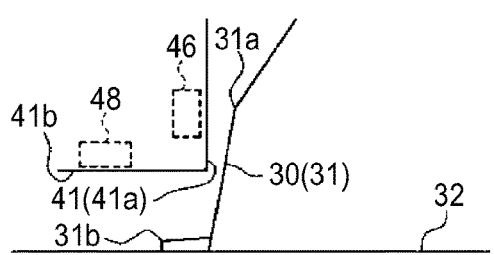
Figure 9E:
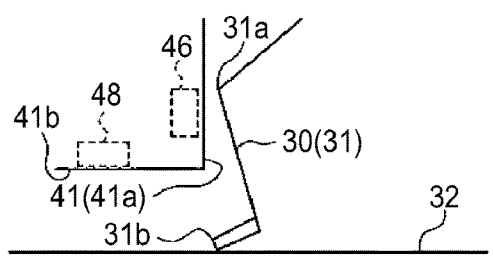
Figure 9F:
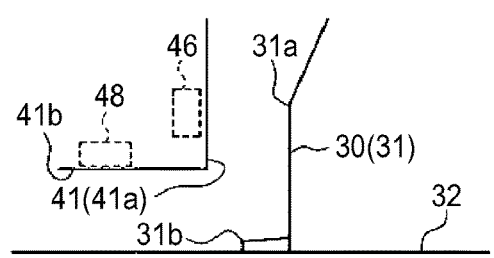

That is, as described above, the user 30 performing the foot operation input inserts the foot tip 31b below the vehicle 41 in a form in which the foot tip 31b is shaken forward about the knee 31a protruding to the vehicle 41 side as a pivot point (see FIG. 9C). Therefore, in a case where the foot operation input of the user 30 is performed correctly, the first lower surface side peak Pb1 indicating the acceleration of the motion of the foot tip 31b in the shaking operation appears between the first peak Pa1 that indicates the acceleration of the motion of the knee 31a protruding to the vehicle 41 side and the second peak Pa2 that indicates the acceleration of the motion of the knee 31a in the foot drawing-down operation.

In addition, when pulling the foot tip 31b inserted below the vehicle 41 back to the outside, the second lower surface side peak Pb2 indicating the acceleration of the motion of the foot tip 31b in the pull-back operation appears in a direction of separation opposite to the first lower surface side peak Pb1. Thus, in a case where the foot operation input of the user 30 is performed correctly, the second lower surface side peak Pb2 appears at the same timing as that of the third peak Pa3 indicating the acceleration of the motion of the knee 31a in the pull-back operation of the foot tip 31b (see FIG. 9E).

In addition, a transition waveform for the acceleration β of the sensor output Sb input into the door ECU 50 from the lower surface proximity sensor 48 illustrated in FIG. 11 is linearly and schematically illustrated in order to highlight characteristic points during the foot operation input described above. In addition, the second lower surface side peak Pb2 indicates the peak of the speed increasing component in the approaching direction for the acceleration β of the sensor output Sb. Thus, the second lower surface side peak Pb2 indicates the peak of the speed increasing component of the detection object in the direction of separation for the acceleration β of the sensor output Sb.

The door ECU 50 of the embodiment determines whether or not the acceleration β of the sensor output Sb input from the lower-surface proximity sensor 48 has a transition having characteristics that are seen during execution of such a foot operation input. Thus, in a case where the first and second lower surface side peaks Pb1 and Pb2 are detected correctly, it is determined that the operation input is performed by the user 30.

Figure 12:
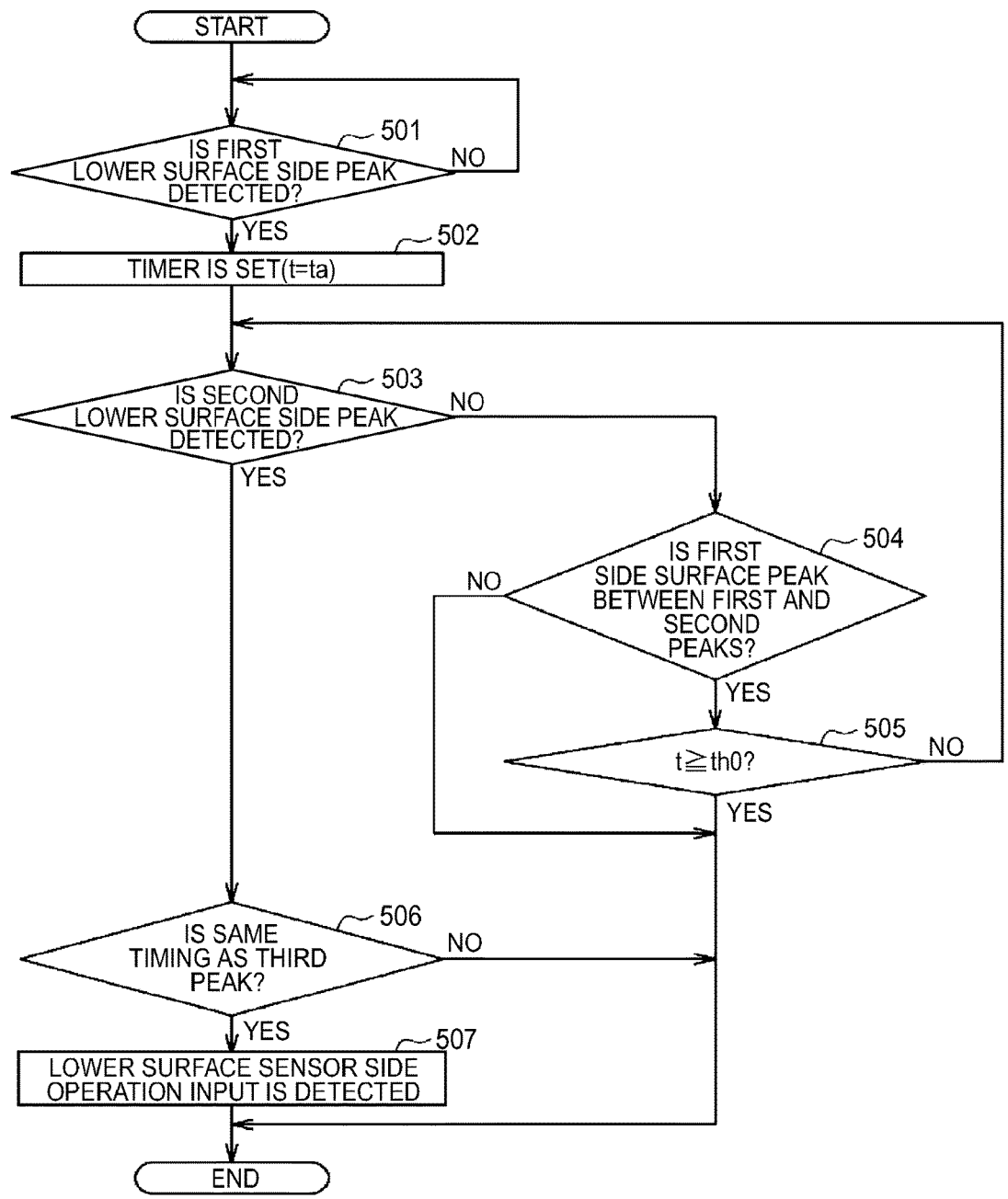
FIG. 12 is a flowchart illustrating a processing procedure of a lower surface side operation input detection determination.

Specifically, as illustrated in a flowchart of FIG. 12, the door ECU 50 of the embodiment sets a timer for counting so as to measure the elapsed time t from the first lower surface side peak Pb1 (t=ta, step 502) if the first lower surface side peak Pb1 is detected in the acceleration β of the sensor output Sb for the lower-surface proximity sensor 48 (step 501: YES). In addition, in step 502, an initial value to of the elapsed time t that is set at the timer for counting is a calculation time required to determine the detection of the first lower surface side peak Pb1 after the acceleration β of the sensor output Sb reaches the peak value β1 in the first lower surface side peak Pb1 for the lower-surface proximity sensor 48. Thus, the door ECU 50 of the embodiment determines whether or not the second lower surface side peak Pb2 in the direction of separation opposite to the first lower surface side peak Pb1 is detected (see FIG. 11, the peak value β2, and step 503).

In addition, the door ECU 50 of the embodiment refers the course of the operation input detection determination of the side surface side based on the sensor output Sa of the side-surface proximity sensor 46 until the second lower surface side peak Pb2 is detected (step 503: NO). Thus, it is determined whether or not the first lower surface side peak Pb1 appeared in the acceleration β of the sensor output Sb for the lower-surface proximity sensor 48 is detected between the first and second peaks Pa1 and Pa2 appeared in the acceleration α of the sensor output Sa for the side-surface proximity sensor 46 (step 504).

The door ECU 50 determines whether or not the elapsed time t from the first lower surface side peak Pb1 reaches a predetermined time th0 that is set in advance (step 505). Therefore, one condition for executing processes following step 506 includes that the first lower surface side peak Pb1 is detected between the first and second peaks Pa1 and Pa2 (step 504: YES) and the elapsed time t from the first lower surface side peak Pb1 does not reach the predetermined time th0 (t<th0, step 505: NO).

The door ECU 50 of the embodiment refers again the operation input detection determination of the side surface side in a case where it is determined that the second lower surface side peak Pb2 is detected in step 503 (step 503: YES). Thus, in a case where it is determined that the second lower surface side peak Pb2 is detected at the same timing as that of the third peak Pa3 appeared in the acceleration α of the sensor output Sa for the side-surface proximity sensor 46 (step 506: YES), it is determined that the foot operation input is performed by the user 30 (step 507).

In addition, in step 504, in a case where it is determined that the first lower surface side peak Pb1 is not detected between the first and second peaks Pa1 and Pa2 (step 504: NO), the door ECU 50 of the embodiment does not execute processes following step 505. In addition, in step 505, in a case where the elapsed time t from the first lower surface side peak Pb1 reaches the predetermined time th0 that is set in advance (t≥th0, step 505: YES), the door ECU 50 of the embodiment does not execute processes following step 506. Thus, in step 507, in a case where it is determined that the second lower surface side peak Pb2 is not detected at the same timing as that of the third peak Pa3 (step 506: NO), the door ECU 50 of the embodiment does not execute the process of step 507.

As described above, in the embodiment, it is possible to obtain the following advantages.

(1) The door ECU 50 determines that the operation input is performed by the user 30 under a condition that the first lower surface side peak Pb1 is detected in the acceleration β of the sensor output Sb for the lower-surface proximity sensor 48 during detecting the first and second peaks Pa1 and Pa2 in the acceleration α of the sensor output Sa for the side-surface proximity sensor 46.

That is, the user 30 performing the foot operation input inserts the foot tip 31b below the vehicle 41 in a form in which the foot tip 31b is shaken out about the knee 31a protruding to the vehicle 41 side as a pivot point. Thus, the first lower surface side peak Pb1 indicating the acceleration of the motion of the foot tip 31b in the shaking-out operation appears between the first peak Pa1 indicating the acceleration of the motion of the knee 31a protruding to the vehicle 41 side and the second peak Pa2 indicating the acceleration of the motion of the knee 31a in the foot drawing-down operation. Therefore, in the embodiment, it is possible to further accurately detect the operation input of the user 30.

(2) The door ECU 50 determines whether or not the second lower surface side peak Pb2 is detected in a direction opposite to the first lower surface side peak Pb1 appeared in the acceleration β of the sensor output Sb for the lower-surface proximity sensor 48 at the same timing as the third peak Pa3 appeared in the acceleration α of the sensor output Sa for the side-surface proximity sensor 46. Thus, it is determined that the operation input is performed by the user 30 under a condition of satisfying the above description.

That is, when the foot tip 31b inserted below the vehicle 41 is pulled back to the outside, the second lower surface side peak Pb2 indicating the acceleration of the motion of the foot tip 31b in the pull-back operation appears in the direction of separation opposite to the first lower surface side peak Pb1. Thus, the second lower surface side peak Pb2 appears at the same timing as the third peak Pa3 indicating the acceleration of the motion of the knee 31a in the pull-back operation of the foot tip 31b. Therefore, in the embodiment, it is possible to further accurately detect the operation input of the user 30.

Moreover, each embodiment described above may be changed as follows.

The operation input detection device and the control device for the vehicular opening-closing body are embodied in the slide door device in the first embodiment and are embodied in the back door device in the second embodiment. However, it is not limited to the embodiments and, for example, for the operation input detection device of the slide door device, a configuration including the side-surface proximity sensor and the lower-surface proximity sensor as in the second embodiment may be provided. In addition, for the operation input detection device of the back door device, a configuration including only the side-surface proximity sensor as in the first embodiment may be provided. Thus, a control object after the operation input is detected may be arbitrary changed. For example, in addition to the slide door, other opening-closing bodies provided in a vehicle such as a side door, a hood, a trunk, and a fuel lid may be opening-closing operated.

In addition, control contents executed by the detection of the operation input may not be necessarily both the opening operation and the closing operation, and may be one of the opening operation and the closing operation. In addition, only unlocking of the opening-closing body may be performed by locking and unlocking operation of locking device. Thus, a device other than the control device for the opening-closing body may be actuated by the detection of the operation input.

In each embodiment described above, the electrostatic capacitance sensor 7 is used in each proximity sensor (side-surface proximity sensors 6 and 46, and the lower-surface proximity sensor 48). However, it is not limited to the embodiments. The proximity sensor type may be arbitrary changed as long as a sensor output is changed by approaching and separating of the detection object. For example, a radio wave type sensor using an antenna, an optical type sensor, an infrared sensor, an ultrasonic sensor may be used.

In the first embodiment, in a series operations in which the foot tip 31b is inserted below the vehicle 1, the foot tip 31b is stopped by drawing back to the ground 32, and then the foot tip 31b is pulled back to the outside, the first to third peaks Pa1 to Pa3 appearing in the transition waveform of the acceleration cc of the sensor output Sa for the side-surface proximity sensor 6 that is provided in the lower side surface portion 1a of the vehicle 1 are detected. In addition, in the second embodiment, in addition, the first and second lower surface side peaks Pb1 and Pb2 appearing in the transition waveform of the acceleration β of the sensor output Sb for the lower-surface proximity sensor 48 that is provided in the lower surface portion 41b of the vehicle 41 are detected. Therefore, in a case where all determination conditions described above in each embodiment are satisfied from the inserting operation to the pull-back operation of the foot tip 31b, it is determined that the operation input is performed by the user 30.

However, it is not limited to the embodiments. For example, for whether or not the peak value α2 of the acceleration cc detected in the second peak Pa2 is smaller than the peak value α1 of the acceleration α detected in the first peak Pa1 (see FIG. 5, step 208), it may not be necessarily the determination condition for detecting the operation input of the user 30. In addition, similarly, for whether or not the difference between the peak value α1 of the acceleration cc detected in the first peak Pa1 and the peak value α3 of the acceleration cc detected in the third peak Pa3 is equal to or less than the predetermined threshold cc (see FIG. 6, step 216), it may not be necessarily the determination condition for detecting the operation input of the user 30. Furthermore, also for the description in which a state where the acceleration α of the sensor output Sa is equal to or less than the predetermined threshold α0 continues between the second and third peaks Pa2 and Pa3 (|α|≤α0, see FIG. 6, and step 205), it may not be necessarily the determination condition for detecting the operation input of the user 30. Thus, it may be determined that the operation input is performed by the user 30 before the third peak Pa3 is detected (step 210) under the condition that the second peak Pa2 in the same direction as that of the first peak Pa1 is detected at the first predetermined interval T1 after the first peak Pa1 is detected (see FIG. 5, step 207: YES).

In addition, in this case, one or a plurality of determination conditions described above may be arbitrary combined. Thus, also in the second embodiment, for the description in which the second lower surface side peak Pb2 in the direction opposite to the first lower surface side peak Pb1 appeared in the acceleration β of the sensor output Sb for the lower-surface proximity sensor 48 is detected, it may not be necessarily the determination condition for detecting the operation input of the user 30.

The side-surface proximity sensor 6 in the first embodiment is provided in the lower side surface portion 4a of the slide door 4 and the side-surface proximity sensor 46 in the second embodiment is provided in the rear side surface portion 45a of the bumper 45. However, it is not limited to the embodiments. The arrangement thereof may be arbitrary changed regardless of back and forth, right and left of the vehicle 1 as long as the position configures the lower side surface portion 1a (41a) of the vehicle 1 (41) facing the user 30. Thus, also for the lower-surface proximity sensor 48, the arrangement may be arbitrarily changed as long as the position configures the lower surface portion 41b of the vehicle 1 below the side-surface proximity sensor 46.

It is preferable that an operation input detection device according to an aspect of this disclosure includes a side-surface proximity sensor that is provided at a lower side surface portion of a vehicle; and an operation input detection portion that detects an operation input based on a sensor output of the side-surface proximity sensor. It is preferable that the operation input detection portion determines that the operation input is performed in a case where when a change in the sensor output indicating proximity of a detection object is detected, after a first peak is detected in an acceleration of the sensor output, a second peak is detected in the same direction as that of the first peak at a first predetermined interval that is set in advance.

That is, when a user performs an operation of inserting a foot tip below a vehicle, a knee of the user approaches the lower side surface portion of the vehicle in which the side-surface proximity sensor is provided in two stages. Therefore, in the side-surface proximity sensor, the first and second peaks appear at a certain interval in the same proximity direction in the acceleration of the sensor output indicating an acceleration of a motion of the knee of the user.

Therefore, in the configuration described above, even if the user does not perform an operation which brings the foot tip near the lower surface portion of the vehicle, it is possible to accurately detect the operation input from the foot of the user. Therefore, it is possible to perform the operation input with a stable posture in which the foot tip inserted below the vehicle is drawn down on the ground. In addition, there is an advantage that it is possible to ensure high detection accuracy with one side-surface proximity sensor provided at the lower side surface portion of the vehicle.

In the operation input detection device according to the aspect of this disclosure, it is preferable that the operation input detection portion determines that the operation input is performed under a condition that a peak value of the acceleration of the sensor output that is detected in the second peak is smaller than a peak value of the acceleration of the sensor output that is detected in the first peak.

That is, when the user inserts the foot tip below the vehicle, in the side-surface proximity sensor, the acceleration of the motion of the knee in a stepping operation of the foot on the vehicle side in a form of protruding the knee appears as the first peak in the acceleration of the sensor output. In addition, the acceleration of the motion of the knee in the operation in which the foot tip inserted below the vehicle is drawn down on the ground appears in the acceleration of the sensor output as the second peak. Therefore, the acceleration of the motion of the knee in the foot drawing-down operation is smaller than the acceleration of the motion of the knee in the stepping operation when the foot tip is inserted below the vehicle. Therefore, in the configuration described above, it is possible to further accurately detect the operation input of the user.

In the operation input detection device according to the aspect of this disclosure, it is preferable that the operation input detection portion determines that the operation input is performed under a condition that a state where the acceleration of the sensor output is equal to or less than a predetermined threshold continues after the second peak is detected.

In the configuration described above, it is possible to set that the user holds (stops) the foot tip inserted below the vehicle in a state of being drawn down on the ground for a certain period of time as one element of the operation input. Therefore, it is possible to further accurately detect the operation input of the user.

In the operation input detection device according to the aspect of this disclosure, it is preferable that the operation input detection portion determines that the operation input is performed under a condition that a third peak is detected in the same direction as those of the first and second peaks at a second predetermined interval that is set in advance after the second peak is detected.

That is, when the user pulls the foot tip inserted below the vehicle back to the outside, the user bends the knee and then performs the pull-back operation of the knee drawn down on the ground. Therefore, in this case, in the side-surface proximity sensor, the third peak, which indicates the acceleration of the motion of the knee approaching the lower side surface portion of the vehicle in which the side-surface proximity sensor is provided, appears again in the acceleration of the sensor output. Therefore, in the configuration described above, it is possible to further accurately detect the operation input of the user.

In the operation input detection device according to the aspect of this disclosure, it is preferable that the operation input detection portion determines that the operation input is performed under a condition that a difference between the peak value of the acceleration of the sensor output that is detected in the first peak and the peak value of the acceleration of the sensor output that is detected in the third peak is equal to or less than a predetermined threshold.

That is, the acceleration of the motion of the knee in the operation in which the user pulls the foot tip inserted below the vehicle back to the outside is substantially equal to the acceleration of the motion of the knee in the operation in which the user moves the foot toward the vehicle to insert the foot tip below the vehicle. Therefore, in the configuration described above, it is possible to further accurately detect the operation input of the user.

In the operation input detection device according to the aspect of this disclosure, it is preferable that the operation input detection device further includes a lower-surface proximity sensor that is provided at a lower surface portion of the vehicle below the side-surface proximity sensor. The operation input detection portion determines that the operation input is performed under a condition that in a case where the first and second peaks are detected by the side-surface proximity sensor in the acceleration of the sensor output, a first lower surface side peak is detected by the lower-surface proximity sensor between the first and second peaks in the acceleration of the sensor output.

That is, the user performing a foot operation input inserts the foot tip below the vehicle in a form of shaking the foot tip forward about the knee protruding to the vehicle side as a pivot point. Therefore, the first lower surface side peak indicating the acceleration of the motion of the foot tip in the shaking operation appears between the first peak that indicates the acceleration of the motion of the knee protruding to the vehicle side and the second peak that indicates the acceleration of the motion of the knee in the foot drawing-down operation. Therefore, in the configuration described above, it is possible to further accurately detect the operation input of the user.

In the operation input detection device according to the aspect of this disclosure, it is preferable that the operation input detection portion determines that the operation input is performed under a condition that in a case where after the second peak is detected in the acceleration of the sensor output, the third peak is detected in the same direction as those of the first and second peaks at a second predetermined interval that is set in advance, and a second lower surface side peak in a direction opposite to the first lower surface side peak is detected by the lower-surface proximity sensor at the same timing as that of the third peak in the acceleration of the sensor output.

That is, when pulling the foot tip inserted below the vehicle back to the outside, the second lower surface side peak indicating the acceleration of the motion of the foot tip in the pull-back operation appears in a direction of separation opposite to the first lower surface side peak. Therefore, the second lower surface side peak appears at the same timing as that of the third peak indicating the acceleration of the motion of the knee in the pull-back operation of the foot tip. Therefore, in the configuration described above, it is possible to further accurately detect the operation input of the user.

A control device for a vehicular opening-closing body according to another aspect of this disclosure includes the operation input detection device according to any one of the above descriptions.

In the configuration described above, it is possible to more easily operate an opening-closing body of the vehicle.

In this disclosure, it is possible to improve convenience.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An operation input detection device comprising:
a side-surface proximity sensor that is provided at a lower side surface portion of a vehicle; and
an operation input detection portion that detects an operation input based on a sensor output of the side-surface proximity sensor, wherein
the operation input detection portion executes a detection determination of the operation input when a change in the sensor output indicating proximity of a detection object is detected,
in the detection determination of the operation input, the operation input detection portion is configured to:
determine whether or not a first peak is detected in an acceleration of the sensor output; and
determine whether or not a second peak is detected in a same direction as that of the first peak in the acceleration of the sensor output in a case where it is determined that the first peak is detected, and
in a case where it is determined that the second peak is detected, the operation input detection portion determines that the operation input is performed when an elapsed time from the first peak to the second peak is a first predetermined interval in which a first predetermined time and a second predetermined time are respectively set as an upper limit value and a lower limit value.

2. The operation input detection device according to claim 1, wherein the operation input detection portion determines that the operation input is performed under a condition that a peak value of the acceleration of the sensor output that is detected in the second peak is smaller than a peak value of the acceleration of the sensor output that is detected in the first peak.

3. The operation input detection device according to claim 1, wherein the operation input detection portion determines that the operation input is performed under a condition that a state where the acceleration of the sensor output is equal to or less than a predetermined threshold continues after the second peak is detected.

4. The operation input detection device according to claim 1, wherein the operation input detection portion determines that the operation input is performed under a condition that a third peak is detected in the same direction as those of the first and second peaks at a second predetermined interval that is set in advance after the second peak is detected.

5. The operation input detection device according to claim 4, wherein the operation input detection portion determines that the operation input is performed under a condition that a difference between the peak value of the acceleration of the sensor output that is detected in the first peak and the peak value of the acceleration of the sensor output that is detected in the third peak is equal to or less than a predetermined threshold.

6. The operation input detection device according to claim 1, further comprising:
a lower-surface proximity sensor that is provided at a lower surface portion of the vehicle below the side-surface proximity sensor,
wherein the operation input detection portion determines that the operation input is performed under a condition that in a case where the first and second peaks are detected by the side-surface proximity sensor in the acceleration of the sensor output, a first lower surface side peak is detected by the lower-surface proximity sensor between the first and second peaks in the acceleration of the sensor output.

7. The operation input detection device according to claim 6, wherein the operation input detection portion determines that the operation input is performed under a condition that in a case where after the second peak is detected by the side-surface proximity sensor in the acceleration of the sensor output, a third peak is detected in the same direction as those of the first and second peaks at a second predetermined interval that is set in advance, and a second lower surface side peak in a direction opposite to the first lower surface side peak is detected by the lower-surface proximity sensor at the same timing as that of the third peak in the acceleration of the sensor output.

8. A control device for a vehicular opening-closing body, the device comprising:
the operation input detection device according to claim 1.

9. The operation input detection device according to claim 1, wherein the side-surface proximity sensor is configured such that a value of the sensor output indicates a position of the detection object and the sensor output is changed by an approaching and a separating of the detection object.

10. The operation input detection device according to claim 9, wherein the operation input detection portion is configured to determine whether or not the first peak, in an approaching direction of the detection object, is detected in the acceleration of the sensor output in the detection determination of the operation input.

* * * * *